Oct. 11, 1966 F. V. TOPPING 3,278,856

FREQUENCY GENERATOR

Filed April 22, 1965 3 Sheets-Sheet 1

INVENTOR.
FREDERICK V. TOPPING

BY Westell & Hanley

Oct. 11, 1966 F. V. TOPPING 3,278,856

FREQUENCY GENERATOR

Filed April 22, 1965 3 Sheets-Sheet 2

INVENTOR.
FREDERICK V. TOPPING
BY Westell & Hanley

Oct. 11, 1966 F. V. TOPPING 3,278,856

FREQUENCY GENERATOR

Filed April 22, 1965 3 Sheets-Sheet 3

INVENTOR.
FREDERICK V. TOPPING
BY Westell & Hanley
PATENT AGENTS

United States Patent Office 3,278,856

Patented Oct. 11, 1966

3,278,856
FREQUENCY GENERATOR

Frederick V. Topping, Toronto, Ontario, Canada, assignor to Topping Electronics Ltd., Leaside, Ontario, Canada Filed Apr. 22, 1965, Ser. No. 450,116
6 Claims. (Cl. 331—11)

This application is a continuation-in-part of my application Serial No. 184,644, filed March 30, 1962, now abandoned.

This invention relates to means and a method of synthesizing electronic signals wherein the means is subject to and the method permits of control to allow the selection, in the output signal of any one of a number of frequencies.

Prior methods or systems for the generation of signals which allow the selection of any one of a number of frequencies, in order to achieve desired stabilities and accuracies have required detailed and non-linear calibration, exceptionally fine setting, a multiplicity of tracked circuits and a large number of harmonic selectors, or the like.

It is an object of this invention to provide means and a method for producing a signal, whose frequency may be controlled and selected; wherein the design of the means and the method is such that tuning of the circuits may be accomplished without extensive calibration or exceptionally fine setting.

It is an object of this invention to provide means and a method for producing a signal whose frequency may be controlled and selected; wherein automatic tuning may be obtained without calibration, where frequency may, if desired, be controlled by a decadally diminutive series of switches or by a diminutive series of switches using different radices.

It will be seen that, in accord with the invention, these objects may be accomplished without a multiplicity of tracked tuning controls and that the various desired frequencies may be selected without the use of variable frequency filters.

Further it will be seen that in a device in accord with the invention, direct calibration may be provided for the smallest adjustment obtainable through the frequency selectors. Such smallest adjustments may, in accord with the invention be discrete or continually adjustable.

It is an object of this invention to provide means and a method wherein a variable frequency oscillator may be controlled to produce any one of a number of frequencies, without the necessity of "tracking" subsidiary elements of a device to correspond to the control selection. By "tracking" is meant the simultaneous movement of a control or a number of controls in a device in accord with movement of a first control where the first control is positively mechanically connected to the other controls movable therewith.

It is an object of this invention to provide means and a method wherein a variable frequency oscillator is provided, adapted to have its frequency varied over a broader range of frequencies by an approximate control means and over a sub-range of said broader range by a fine control means.

It is an object to provide a method and means to control an oscillator to produce one of a number of frequencies, which may be accurately selected and provided without calibrating the oscillator.

It is an object of this invention to provide means and a method of controlling a variable frequency oscillator to produce any one of a number of frequencies, said means and method using at least two incremental frequency switching steps, wherein the oscillator is included in a feedback loop and frequencies in said loop are compared with a reference frequently, said loop being adapted to be phase locked and wherein the design is such that an error in output frequency of the oscillator, greater than the smallest switching increment, may be corrected by the combination of the reference frequency and the phase locked loop.

In drawings which illustrate a preferred embodiment of the invention:

Figure 1:
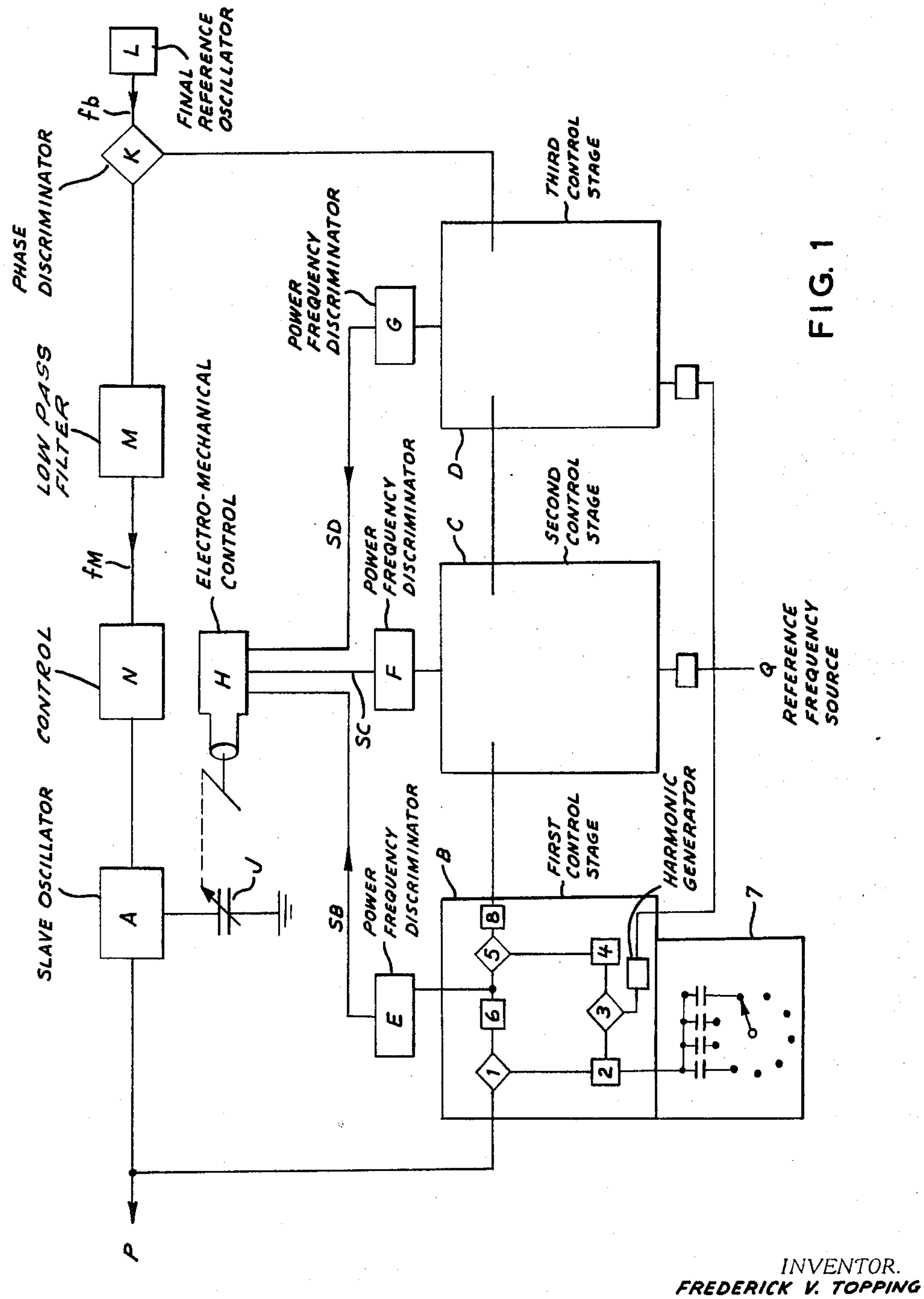
FIGURE 1 is a block diagram of the circuit as a whole.
Figure 2:
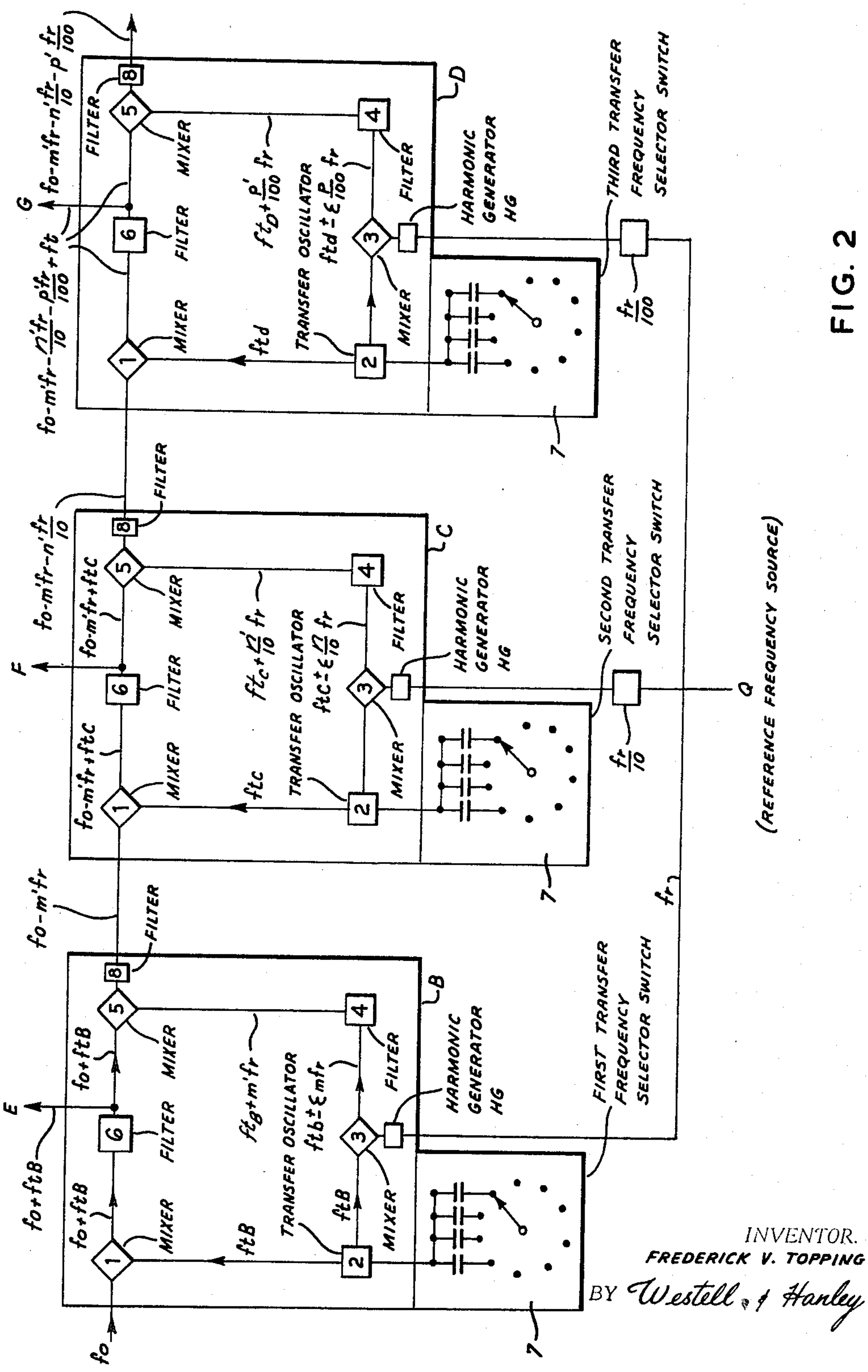
FIGURE 2 illustrates the components and signals in three of the blocks of FIGURE 1.

In accord with the invention, a slave oscillator A is mechanically controllable by the control J (shown schematically) to provide an output frequency $f_o$ variable by the mechanical control J over the desired range of output frequencies of oscillator A. The slave oscillator A is also controllable over a sub-range of frequencies less than said desired range by an electronic signal supplied from control N. The output $f_o$ of slave oscillator A, to be used, is supplied along line P. A portion of the output $f_o$ is fed back to a first control stage B.

The first control stage B comprises a free running transfer oscillator B2 having a signal output of frequency $f_{tb}$ adapted to be controlled by a multiple position switch B7 which provides means for changing the transfer frequency $f_{tb}$ by increments $f_I$ the increments $f_I$ being preferably obtained approximately by dividing the basic frequency range of slave oscillator A by the number of positions on switch B7. In the preferred embodiment, the slave oscillator range is 2 megacycles and B7 is a 20-position switch, the movement from one switch position to the next, representing an increment of approximately 100 kilocycles. The output $f_{tB}$ of the transfer oscillator is therefore a basic frequency, plus or minus the sum of a number of increments $f_I$ determined by the position of switch B7. The output frequency $f_o$ and transfer frequency $f_{tB}$ are combined at mixer B1 and the output of the mixer B1 filtered at filter B6 to pass only the sum $f_o+f_{tB}$ to a power frequency discriminator E.

The frequency discriminator E is tuned to a predetermined frequency and tuned to provide a control signal SB proportional to the difference of the sum $f_o+f_{tB}$ from the predetermined tuned frequency, the signal being polarized in accord with whether the sum $f_o+f_{tB}$ is larger or smaller than the tuned frequency. This control signal SB is applied to actuate a control H (shown in FIGURE 3 and later described in detail) which causes, through mechanical control J, a variation of the frequency $f_o$ of the slave oscillator A, the control H–J being designed to alter the frequency of slave oscillator A, in response to control signal SB in a direction which will cause, through variation of $f_o$ a reduction of control signal SB. Thus an increase of $f_{tB}$ due to alteration of switch B7 will increase the sum $f_o+f_{tB}$ and the result of the consequent control signal SB will be to cause a reduction in $f_o$ to tend to make the sum $f_o+f_{tB}$ the same as before. The converse is also true. Thus the switch B7 directly controls the value of the output frequency. Further control is provided, both to supply smaller increments of frequency control than those provided by switch B7 and also to correct for approximations in the response by control H–J to signal SB. This further control will now be described. The output $f_{tB}$ of the transfer oscillator is also combined at mixer B3 with a signal $\Sigma mf_r$ (where $m$ may equal (=) 1, 2, 3 . . . $n-1$, $n$; all the values being integers) being the range of harmonics of a frequency $f_r$, or the basic frequency. The signal $\Sigma mf_r$ is obtained by passing a frequency obtained from a frequency reference standard Q, through a harmonic generator HG. Frequency $f_r$ is chosen so that frequency change $f_I$ represented by the steps in switch B7 (except for minor inaccuracies in frequency $f_{tB}$) is an integral multiple of $f_r$. In fact $f_I$ will usually equal $f_r$. There is produced by the mixer, B3, a comb-like signal which is a carrier of frequency $f_{tB}$ having many side-bands $f_{tB} \pm \Sigma mf_r$ being a series of frequencies, each spaced from the next by a frequency $f_r$. In the preferred embodiment, $f_r$ equals 100 kilocycles.

The comb-like signal is passed through a filter B4 having a fixed frequency pass band sufficiently wide to pass only one of the transfer frequency sidebands the output of filter B4 being a signal having a single fixed frequency equal to $f_{tB}+m'f_r$ where $m'f_r$ is a specific desired harmonic of $f_r$. The signal $f_{tB}+m'f_r$ is combined at a mixer B5 with the signal $f_o+f_{tB}$ from the band pass amplifier B6 and the difference frequency $f_o-m'f_r$ obtained by passing the output of the mixer B5 through a filter B8. Thus it will be noted that the transfer frequency $f_{tB}$ has been used to provide the control signal SB and to provide harmonic sidebands (from which one sideband has been selected) but the transfer frequency has been eliminated from the output of stage B.

It will be noted that if $f_{tB}>f_o$ the same desired results may be obtained by:

(a) Taking the difference output of mixer B1 being $f_{tB}-m'f_o$.

(b) Selecting, at filter B4, a subtractive sideband from the spectrum mixer being $f_{tB}-m'f_r$.

(c) Selecting the difference output of a mixer B5 to produce a signal $f_{tB}-m'f_r-(f_{tB}-f_o)=f_o-m'f_r$.

In this event discriminator E would be tuned to the predetermined value of $f_{tB}-f_o$.

If $f_{tB}<f_o$ the desired result may be obtained by:

(a) Taking the difference output of mixer B1, being $f_o-f_{tB}$.

(b) Selecting at filter B4, the sideband $n'f_r-f_{tB}$.

(c) Selecting at mixer B5 the output $$f_o-f_{tB}-(m'f_r-f_{tB})=f_o-m'f_r$$

In this event the discriminator E would be tuned to the predetermined value of $f_o-f_{tB}$.

Both alternative methods of control are within the scope of the invention. Further discussion will deal however with the first method of combining the various frequencies, although the discussion will mutatis mutandis apply to the other alternatives discussed. Moreover it should be realized that one of the alternatives may be used in one stage, another in another stage and the same or another in a further stage since each stage is to this extent independent.

If switch B7 is moved one position to increase $f_{tB}$ then the increase is approximately $f_r$. The result of the consequent increase in $f_{tB}$ to $f_{tB}'$ is to reduce $f_o$ by the same amount $f_r$ (subject to perfect operation of control H–J). The increased transfer frequency in the comb signal applied to filter B4 results in B4 letting through the next lower sideband of the comb signal, than formerly, namely $f_{tB}'+(m-')f_r$. Thus it will be seen that the signal after the switch change $f_o-(m-')f_r$ is equal to the signal before the switch change $f_o-m'f_r$ and thus the signal from filter B8 (subject to perfect operation of control H–J) is the same for all values of $f_{tB}$. Thus it will be noted that (excluding for the moment, variations in $f_o$ due to the failure of control H–J to completely eliminate the control signal SB and the incidental changes in $f_{tB}$) the signal $f_o-m'f_r$ is independent of the value of $f_o$ or the value of $f_{tB}$ (and thus independent of switch B7).

Although the above discussions assume that the control H–J will reduce the control signal SB to zero, this is approximate and not exact, and hence the output frequency is, in the preferred embodiment, further corrected by apparatus to be described hereafter.

The output signal of stage B being $f_o-m'f_r$ is applied to stage C which has the same arrangements as stage B, but which is designed so that its transfer oscillator control switch C7 will provide a number of switch positions, representing frequency increments, and the total switch range C7 approximately equals the increment value from one position to the next of switch B7. In the preferred embodiment C7 has ten positions and movement of switch C7 between adjacent positions, represents a frequency increment of approximately 10 kilocycles. Similarly the switch D7 in the third stage of the preferred form has ten positions each representing a change of approximately 1 kilocycle from the preceding position. In stages C and D the signals are as shown.

In stage C power discriminator F (connected as is the discriminator E in stage B) is designed to provide a control signal SC for control H–J for deviation of the frequency $f_o-m'f_r+f_{tC}$ from a predetermined tuned frequency value of discriminator F. Thus it will be seen that for an increase in $f_{tC}$ of $f_r/10$ due to movement of C7 through one switch position, the correction due to control signal SC will be approximately the amount $f_r/10$. Similarly the signal from filter C4 will have the same value for any value of $f_{tC}$ since for $f_{tC}'=f_{tC}+f_r/10$ the signal $f_{tC}+n'f_r/10$ will be replaced by the signal $$f_{tC}+(n-')f_r/10$$

of the same frequency. Then it will be noted that the output signal $f_o-m'f_r-n'f_r/10$ of stage C will be unaltered by changes on B7 or C7, subject to the ability of discriminator F to adjust slave oscillator A to eliminate the error signal from discriminator F. Moreover, it should be noted that the discriminator F acts upon the deviation of the frequency $f_o-m'f_r+f_{tC}$ from the discriminator tuned value to provide a signal to move control H–J not only to act in accord with changes in the value $f_{tC}$ but will also correct for failure of control H–J to respond fully to the control signal from discriminator E.

Stage D operates in similar manner to the preceding stages with a switch D7 having 10 steps each representing a 1 kilocycle change in $f_{tD}$. The control signal SD from power discriminator G is actuated by deviations of the signal $f_o-m'f_r-n'f_r/10+f_{tD}$ from a predetermined tuned frequency and thus compensates not only for switching changes in $f_{tD}$ but also to prior failure of control H–J to respond fully to error signals from discriminators E and F. Thus errors in response to the respective discriminators E, F, and G are not cumulative and in fact each discriminator acts to eliminate errors in $f_o$ due to inaccurate response to the larger increment stages.

In fact, the output of D stage $$f_o-m'f_r-n'f_r/10-p'f_r/100$$

varies from a constant value only by the error of response of control H–J to signal SD from the last stage D. Preferably the error in the output signal from each stage B or C is not more than 1½ times the increment value of that stage. Note also that on the swiching of a switch 7, the stage switched and all the smaller incremental stages will tend to move control H–J to return the output signal of the stage switched and the smaller incremental stages to an approximation of its designed value. It should also be realized that alternatives mentioned in column 3 for the methods of selection at elements 1, 4, and 5, may if desired be used with the necessary changes in frequency values, in stages C and D.

In order to avoid confused response by control H–J to simultaneous signals from more than one discriminators E, F, G; the control H is designed to ignore error signals from a lower incremental stage until it has completed its response to any simultaneous error signals from a higher incremental stage.

Figure 3:
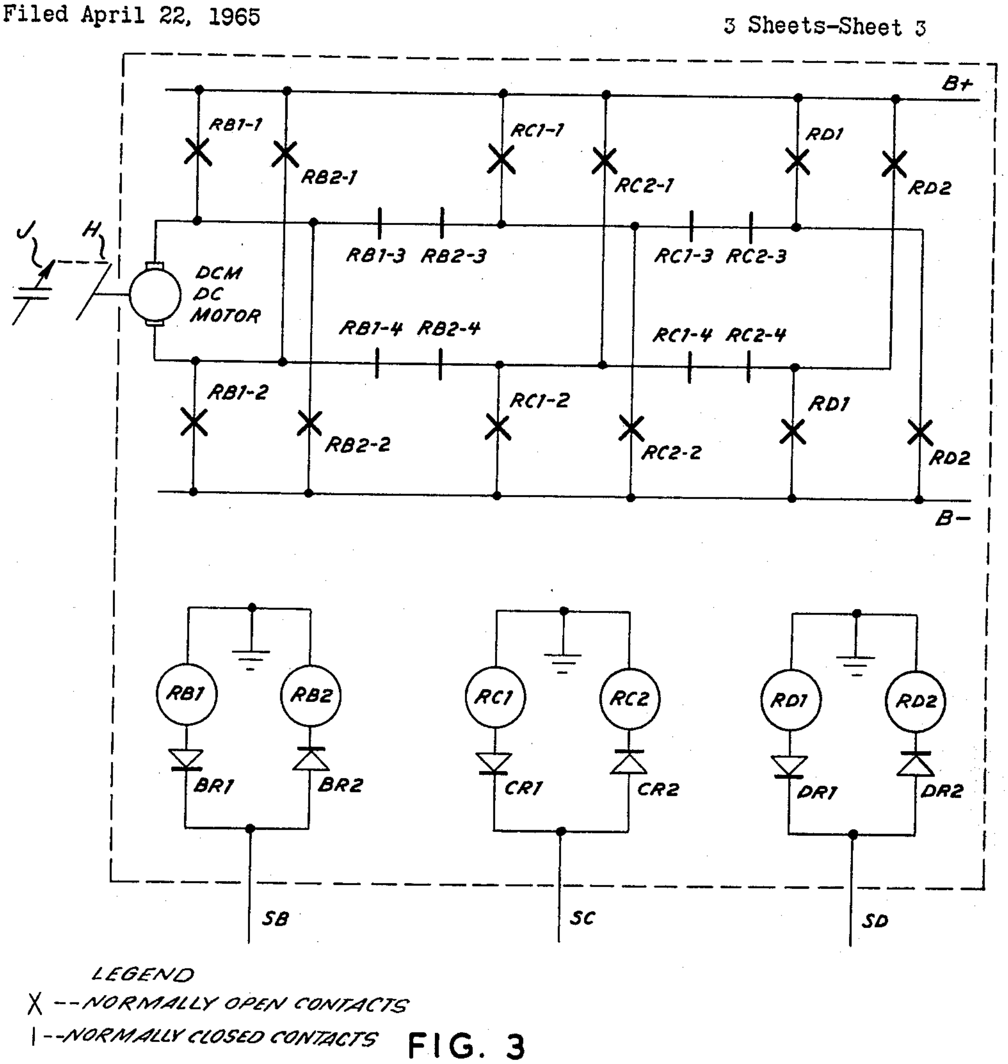
FIGURE 3 illustrates a mode of operating part of the circuitry of FIGURE 1. By "mixer product frequencies" I include the signals emanating from a mixer which are characteristic of the sums or the difference of one of the input frequencies or one of its harmonics, on the one hand and the other of the input frequencies or one of its harmonics, on the other hand.

The control 4 may be designed to operate in any one of a number of well known ways and one of these is shown in FIGURE 3.

In FIGURE 3, the control H–J is shown as operated by a D.C. motor DCM of a type whose rotation may be reversed by reversing the polarity of connection to the motor.

The line carrying control signal SB is connected through two parallel circuits to ground. One is through relay RB1 and rectifier BR1 in series, the other through relay RB2 and rectifier BR2 in series. The rectifiers BR1 and BR2 are oriented in opposite directions so that for one sense of signal SB relay RB1 tends to be operated and for the other sense relay RB2 tends to be operated. However relays RB1 and RB2 are designed not to operate when the signal SB is below a certain voltage and this value is chosen in relation to the characteristics of discriminator E that the relays RB1 or RB2 are not operated respectively by either polarity of signal SB unless the frequency $f_o+f_{tB}$ differs from the tuned frequency by more than approximately ½ the frequency steps of control B7.

Similar connections for signal SC are provided, in one polarity through rectifier CR1 and relay RC1 to ground and in the other polarity through rectifier CR2 and relay RC2 to ground. The relays are respectively designed to operate when the frequency to discriminator F differs by more than ½ the frequency steps of control C7 and not to operate or to be de-energized below that level.

Similar circuitry is provided for signal SD with relays RD1 and RD2 respectively designed to operate when the signal to discriminator D is more than ½ the frequency steps of control D7.

The DCM motor leads are respectively connectable to B+, and B− through two sets of normally open contacts −1 and −2 of relay RB1; and are respectively connected to B+ and B− through two sets of normally open contacts −1, and −2 of relay RB2. The connections are such that connection of the motor to the B+ and B− sources through the RB1–1 and −2 contacts will cause rotation in the sense opposite to connection of the motor to the B+ and B− sources through the RB2–1 and −2 contacts.

Similar connections for the motor leads from the B+ and B− sources are provided through normally open −1 and −2 contacts of relay RC1 or alternatively through the normally open −2 and −1 contacts of relay RC2; a change from one alternative to the other reversing the motor direction. However the motor leads between the motor and the RC normally open contacts are respectively interruptible by the opening of either the normally closed −3 and −4 contacts of relay RB1 or the normally closed −3 and −4 contacts of relay RB2.

Similar connections for the motor leads from the B+ and B− sources are provided through the normally open −1 and −2 contacts of relay RD1 or alternatively through the normally open −2 and −1 contacts of relay RD2; a change from one alternative to the other reversing the motor direction. However the motor leads between the motor and the RD normally open contacts, are respectively interruptible by the opening of either the normally closed −3 and −4 contacts of relay RC1; the normally closed −3 and −4 contacts of relay RC2; the normally closed −3 and −4 contacts of relay RB1; or the normally closed −3 and −4 contacts of relay RB2.

The design of discriminator E is so related to the orientation of rectifiers BR1 and BR2 and the connections of relays RB1 and RB2, that a signal from discriminator E in a sense indicating that the frequency $f_o+f_{tB}$ differs from the tuned frequency of discriminator E in one direction by more than ½ the B7 frequency steps, results in the operation of the RB relay which will cause the motor DCM to rotate the control H–J in a direction to alter $f_o$ in a sense to alter the sum $f_o+f_{tB}$ toward the tuned frequency of discriminator E until the signal from discriminator E is less than the design limit for operation of relays RB1 and RB2 at which time these relays are de-energized, stopping the motor.

Similarly the connections from discriminators F and G to the motor connections are such that as a result of a signal appearing at the input of discriminator F or discriminator G, and differing enough from the tuned frequency to cause operation of one of the RC or one of the RD relays, will cause the motor to rotate control H–J in a direction to alter (by altering $f_o$) the signal appearing at the discriminator, toward the discriminator tuned frequency until the difference of the signal from the tuned frequency is low enough to cause de-energization of the R relay, stopping the motor.

When the system shown in FIGURE 3 is in operation, the signals are continually appearing at the inputs. The contacts of relays RB, RC and RD remain in their normal state and the motor DCM is stationary unless one or more of the signals at the discriminators differ from the tuned value thereof by more than the design limits. When one only of such signals differs from its discriminator tuned frequency by more than the design limit, then the signal from such discriminator will operate its appropriate R relay to cause the motor to reduce the difference by varying $f_o$ in the correct sense until the difference is below the design limit when the de-energization of the R relay will stop the motor. When the signal appearing at discriminator E differs from the tuned frequency sufficiently to cause the operation of one of the RB relays then both the −3 or −4 contacts of that one of the RB relays will open so that signals from discriminators F or G cannot tend to cause operation of the motor until the signal at discriminator E has returned close enough to the tuned frequency to de-energize the formerly energized RB relay. When the signal appearing at discriminator F differs from the tuned frequency sufficiently to cause the operation of one of the RC relays, then both the −3 or −4 contacts of that one of the RC relays will open so that signals from discriminator G cannot cause operation of the motor until the signal at discriminator F has returned close enough to the tuned frequency to de-energize the formerly energized RC relay.

The output of the 1 kc. stage, D as already discussed, tends to be variable only to the extent of the failure of the control H–J, as ultimately controlled by the stage D, to completely eliminate the error signals. The design of the three frequency discriminators is such that output of stage D being $f_o-m'f_r-n'f_r/10-p'f_r/100$ (called $f_a$ hereafter) is within the range of output of a variable oscillator (in the preferred embodiment having an output of from seven to eight kilocycles). The output $f_a$ is applied to one of two input terminals of phase discriminator K and to the other input terminal, is applied the output $f_b$ of a variable final reference oscillator L.

The system is designed and constructed to provide that the signal $f_a$ (which is a constant value except for the failure of discriminator G to fully adjust control H–J and variations in $f_t$) is within the range of variations of $f_b$.

The output of phase discriminator K, initially includes an alternating signal having a frequency which is the difference $|f_a-f_b|$ of the input frequencies originating from stage D and from the variable oscillator L. The output of phase discriminator K is connected to low pass filter M which is designed and constructed to pass only signals of frequency smaller than the lowest permissible value of $f_a$. Thus the low pass filter M passes only an alternating current signal $f_M$ of fresuency $|f_a-f_b|$. The output of filter M is connected to the electronic control N of slave oscillator A, and the effect through control N of the alternating signal is to cause the slave oscillator output frequency to vary over a wide range of frequencies, including the frequency which will cause the signal $f_a$, to equal $f_b$. At the instant $f_a$ equals $f_b$, a signal is generated in the phase detector, and passed by low pass filter M which is proportional to the phase difference between the two applied signals $f_a$ and $f_b$. At this instant through the feedback circuit from slave oscillator A including, in order elements B–C–D–K–M–N and back to A "phase lock" of the feedback circuit, and slave oscillator A is established. Phase lock is the condition which exists when the two frequencies $f_a$ and $f_b$ applied to the phase discriminator differ only in phase but are equal in frequency, where one of said signals is controlled by the output of the phase discriminator.

It will be seen that the slave oscillator frequency $f_o$ is directly related, firstly; to the predetermined harmonics and sub-harmonics of the fixed frequency reference, $f_r$ (such harmonics and sub-harmonics being selected by the three transfer oscillator frequency adjustments) and secondly to: the reference frequency $f_b$ as indicated by the following formula (with the system "phase locked")

$$(f_a=f_b)$$

$$f_o-m'f_r-n'f_r/10-p'f_r/100=f_b$$

$$f_o=f_b+m'f_r+n'f_r/10+p'f_r/100$$

It will be seen that in the system provided, the signal $f_a$ is the sum of a reference signal $f_b$ and the stage increments $m'f_r$, $n'f_r/10$ and $p'f_r/100$. Each stage increment, say $n'f_r/10$ is selected in a circuit C2–C3–C4 paralleling, but not part of the main feedback circuit A–B1–B6–B5–C1–C6–C5–D1–D6–D5.

Thus there is, as far as the main circuit is concerned, no risk of false locking, since no alternative incremental values are presented to the main feedback circuit. Thus the range of variation of the signal in the main circuit from the desired or "phase-locked" value, may in many cases vary over a greater range than the smallest increments, and the range is limited only by other factors, such as the "capture" range of the phase-locked circuit dependent in turn upon the frequencies passed by low-pass filter M and other parameters well known in the art. This may be compared with prior devices wherein the desired frequency as well as undesired frequencies spaced therefrom are simultaneously existent in parts of the main loop. It is thus required in such prior devices that the design be such that no variation in the desired frequency may take place amounting to more than the switching increments, since one of the undesired signals in the circuit would then cause phase locking.

Moreover in other prior devices, it has been, or is necessary that a filter be included in the feedback loop having a bandwidth not wider than the smallest frequency control increments in the loop. In such devices the deviation of the signal in the controlled oscillator cannot exceed the filter bandwidth because no signal would be passed through the loop. In accord with this invention there is no such limitation on the slave oscillator signal deviation since such filter is not required.

It will be understood that, if desired, the frequency of variable frequency oscillator L may be replaced by a (low) frequency $qf_r$ derived from the reference frequency $f_r$ in which case, the output frequency will no longer be continuously variable but will be variable over discrete steps determined by the smallest frequency increment in a switching stage.

It will be appreciated that any number of switching stages may be utilized to suit both the range desired by the slave oscillator and the smallest incremental change desired within the said range.

It will be appreciated that it is not necessary to utilize decade switching but that any desired number of switches may be used in a given stage, but the frequency range provided by any given stage would, in almost all cases have to be equal or greater than the increments in the next higher stage. Moreover the frequency increment represented by movement of a switch 7 through one position must be approximately equal to the sideband spacing of the "comb-like" signal or an integral multiple thereof. It will be seen that there has been provided a system and method for producing a wide range of frequencies which system and method offer several advantages in synthesizer design and production. Much of the extensive calibration of existing systems is avoided.

In the preferred embodiment, tuning is accomplished by means of decade or duo decade switches, employing a minimum of components and requiring no tracking; that is, the change of a switch does not require that any other element in the system be simultaneously altered through a positive mechanical connection to the switch. Calibration problems are virtually eliminated and since the decade units are functionally identical, a modular design is both feasible and practical, allowing, if desired, the addition of larger or smaller incremental stages at either end of a given switching range.

With reference to the invention, not only in the specific embodiment, but in the broader aspects thereof, it will be seen that only one phase lock loop is required. From the output equations above it will be seen that accuracy of the controlled oscillator depends only on the accuracies of $f_r$ and $f_b$. The frequency $f_r$ may be made as accurate as required by employment of a suitable standard oscillator.

In the disclosure in column 3 herein it is pointed out that in a stage $f_I$, the incremental frequency change produced by a one position change is approximately equal to $f_r$ the frequency spacing between sidebands appearing at filter 4, and that all sideband spacings $\Delta f_r$ in a stage are equal. However, it will be seen that the device may still be made to operate, in accord with the invention, if:

(a) (With equally spaced sidebands) the incremental frequency change $f_I$ produced by changing the position of switch 7 is any integral multiple of equal sideband frequency spacing, or:

(b) In the event that, for a specific purpose sidebands $f_o\pm\Sigma\Delta f_r$ are provided having irregular frequency spacing, the change $f_I$ in each case is of an amount to bring a desired sideband to the acceptance frequency of the filter 4.

I claim:

1. In a frequency synthesizer means for producing an output signal, of frequency varying over a predetermined range of frequencies, comprising: a slave oscillator, adapted to provide an output signal, said slave oscillator being constructed and designed to have the frequency of its output signal altered over said predetermined range, by an electrically responsive mechanical control connected thereto; means for providing a transfer signal of frequency $f_t$, means for varying frequency $f_t$ in predetermined increments; a first mixer for mixing said transfer signal with a fed back portion of said output signal, first filter means connected to the output of said first mixer for selecting from said first mixer a signal of one of the first mixer product frequencies, means connected between the output of said first filter and said slave oscillator tuned to a predetermined value of said selected frequency, said last mentioned connected means being designed and constructed to respond to the difference between said predetermined and actual value of said selected frequency to cause said electrically responsive mechanical control to vary the output frequency of said slave oscillator in a sense to reduce said difference, means for producing a signal, comprising said transfer frequency and a series of selectable sidebands thereof, each of said sidebands differing from the nearest in frequency by predetermined increments corresponding to predetermined increments of variation of said transfer frequency; means for applying said signal and sidebands to a second filter means designed to pass frequencies over a predetermined frequency range not greater than the frequency spacing between said predetermined increments, whereby the output of said second filter means comprises a signal of the frequency of one of the said sidebands, a second mixer adapted to receive said last mentioned signal and said selected signal, third filter means for filtering the output of said second mixer to obtain a signal therefrom having a frequency which is the difference of said output frequency and the sum of the increments of frequency between said transfer frequency and said sideband passed by said filter, and from which the value of the transfer frequency has been eliminated; said filter for providing one of said sidebands being designed in relation to the composition of said selected signal so that the sideband passed by said last-mentioned filter is so composed that the value of said transfer frequency may be eliminated at said second mixer; said slave oscillator being provided with a separate electronic control variable over a sub-range less than said slave oscillator output range, said electronic control being actuable by a phase discriminator having two input terminals; means connected to one input of said phase discriminator and to the output of said means for filtering the output of said second mixer for producing and applying to said one input of said phase discriminator a signal varying as the difference of said output frequency and the sum of said increments, means for applying to the other input of said phase discriminator, a reference frequency, whereby said phase discriminator, when said inputs differ in frequency, provides a varying control signal for said slave oscillator electronic control whereby the output frequency of said slave oscillator varies over a range of frequencies which includes the output frequency which will cause the frequency input to said one input to equal said reference frequency, whereby the circuit including said slave oscillator, the path of said fedback output signal, said phase discriminator and said electronic control, is phase-locked.

2. A frequency synthesizer as claimed in claim 1 wherein said reference frequency is continually variable.

3. In a frequency synthesizer for producing an output signal of frequency variable over a predetermined range of output frequencies, comprising; a slave oscillator, means actuable in response to an electrical signal to vary said slave oscillator output frequency; means for providing a transfer signal, means for varying the frequency of said transfer signal in predetermined increments, means for deriving from said output signal a frequency varying therewith, a first mixer for mixing said transfer signal with said derived signal, means for selecting from the output of said first mixer, a comparison signal having the frequency of one of the first mixer product frequencies and applying said comparison signal to a device tuned to a predetermined frequency and designed and constructed to provide an electrical signal to said actuable means varying as and polarized in accord with the frequency difference between said comparison signal and said tuned frequency, to cause when said electrical signal exceeds a predetermined magnitude said actuable means to vary the frequency of said slave oscillator in a sense which will reduce said difference between said comparison signal and said tuned frequency; wherein said predetermined increments are equal, means are provided for producing from said transfer signal, a series of signals including said transfer signal and a series of sidebands thereof, being each separated from the next by a frequency increment equal to said predetermined increments, a filter having a band pass range less than the value of such increment, means supplying said transfer frequency and said series of sidebands to said filter, whereby a single one of said sidebands appears in the output of said filter, a mixer connected to receive said single sideband and the said comparison signal, the output of said mixer being connected to a filter arranged to provide a resultant signal having a frequency being the difference between said derived signal and the frequency separation between said transfer frequency and said one sideband, said filter for passing a single sideband being selected, in relation to the composition of said comparison signal so that the value of said transfer frequency may be eliminated from said resultant signal, means for providing a reference signal, means for comparing a signal derived from said resultant signal with said reference signal, to provide a second control signal; means for applying said second control signal to an electronic control for said slave oscillator, said control being designed to vary the output frequency of said slave oscillator in response to said second control signal in a sense to cause said derived resultant signal to equal said reference signal.

4. In means for frequency synthesis involving the production of an output signal of frequency variable over a predetermined range of output frequencies, including a slave oscillator designed to have the frequency of its output signal varied in response to a control signal, and means for feeding back a signal derived from said output signal, means responsive to said fed back part of said output signal to produce said control signal comprising: means for providing a transfer frequency of frequency $f_t$ means for varying frequency $f_t$ in predetermined increments; a first mixer for mixing said transfer signal with said fed back part of said output signal, first filter means for selecting from the output of said first mixer a mixer product frequency; means for producing from said transfer frequency a signal comprising said transfer frequency and a series of sidebands thereof, each of said sidebands differing from the nearest in frequency by predetermined increments corresponding to said predetermined increments of variation of said transfer frequency; means connecting the last mentioned means for producing a signal to a second filter means having a fixed frequency pass band and designed to pass frequencies over a predetermined frequency range not greater than the frequency spacing between said predetermined increments; whereby the output of said second filter means comprises a signal of the frequency of one of the said sidebands, a second mixer adapted to receive said last mentioned signal and said selected signal, third filter means connected to receive the output of said second mixer, designed and constructed to select from the mixer product frequencies of said second mixer, the mixer product signal which is independent of said transfer frequency, said second filter means for providing one of said sidebands being designed in relation to the composition of said selected signal so that the sideband passed by said last-mentioned filter is so composed that the value of said transfer frequency may be eliminated at said third filter means; means for utilizing the mixer product signal which is independent of said transfer frequency to provide such control signal for said slave oscillator.

5. In means for producing an output signal as claimed in claim 4, wherein there is provided means, in addition to the output of said second mixer for controlling said slave oscillator comprising: an electrically responsive mechanical control designed, constructed and connected to vary the frequency of said slave oscillator in response to electrical signals supplied to said control; means tuned to a predetermined value of said first mixer product designed and constructed to respond to the difference between said predetermined and actual value of said selected frequency and to provide said control signals; a connector for supplying said mixer product to said tuned means; and a connector for supplying said control signals to said electrically responsive mechanical control.

6. In a frequency synthesizer for producing an output signal of frequency variable over a predetermined range of output frequencies, comprising; a slave oscillator, means actuable in response to an electrical signal to vary said slave oscillator output frequency; means for providing a transfer signal, means for varying the frequency of said transfer signal in predetermined increments, means for deriving from said output signal a frequency varying therewith, a first mixer for mixing said transfer signal with said derived signal, means for selecting from the output of said first mixer, a comparison signal having the frequency of one of the first mixer product frequencies and applying said comparison signal to a device tuned to a predetermined frequency and designed and constructed to provide an electrical signal to said actuable means varying as and polarized in accord with the frequency difference between said comparison signal and said tuned frequency, to cause when said electrical signal exceeds a predetermined magnitude said actuable means to vary the frequency of said slave oscillator in a sense which will reduce said difference between said comparison signal and said tuned frequency; wherein means are provided for producing from said transfer signal, a series of signals including said transfer signal and a series of sidebands thereof, being each separated from the next by a frequency increment of which said predetermined increments are integral multiples, a filter having a band pass range less than the value of such increment, means supplying said transfer frequency and said series of sidebands to said filter, whereby a single one of said sidebands appears in the output of said filter, a mixer connected to receive said single sideband and the said comparison signal, the output of said mixer being connected to a filter arranged to provide a resultant signal having a frequency being the difference between said derived signal and the frequency separation between said transfer frequency and said one sideband, said filter for passing a single sideband being selected, in relation to the composition of said comparison signal so that the value of said transfer frequency may be eliminated from said resultant signal, means for providing a second transfer signal, means for varying the frequency of said secod transfer signal in predetermied increments smaller than the increments by which said first mentioned transfer signal is varied, means for deriving from said resultant signal a frequency varying therewith, a third mixer for mixing said second transfer signal with said derived resultant signal, means for selecting from the output of said third mixer a second comparison signal of one of the third mixer product frequencies and applying said second comparison signal to a second device tuned to a second predetermined frequency and designed and constructed to provide a second electrical signal to said actuable means proportional to and polarized in accord with the frequency difference between said second comparison signal and said second predetermined frequency, to cause said actuable means to vary the frequency of said slave oscillator in a sense which will reduce said difference between said second comparison signal and said second tuned frequency; and means resposive to the existence at said actuable means of said first mentioned electrical signal of amount sufficient to cause varying of said slave oscillator frequency, to prevent during such existence said second electrical signal from affecting said actuable means.

References Cited by the Examiner

UNITED STATES PATENTS

| | | | |
|---|---|---|---|
| 2,581,594 | 1/1952 | MacSorley | 331—38 X |
| 2,679,005 | 5/1954 | Bataille et al. | 331—39 |
| 2,786,140 | 3/1957 | Lewis | 331—22 X |
| 2,810,832 | 10/1957 | Broadhead | 331—22 X |
| 3,126,515 | 3/1964 | Berman | 331—22 |

FOREIGN PATENTS

| | | |
|---|---|---|
| 714,684 | 9/1954 | Great Britain. |

ROY LAKE, *Primary Examiner.*

J. B. MULLINS, *Assistant Examiner.*